US012361990B1

(12) United States Patent
Pilo et al.

(10) Patent No.: US 12,361,990 B1
(45) Date of Patent: Jul. 15, 2025

(54) MEMORY WITH EXTERNAL CLOCK SYNCHRONIZED OPERATION

(71) Applicant: Synopsys, Inc., Sunnyvale, CA (US)

(72) Inventors: Harold Pilo, Underhill, VT (US);
Sanjiv Kainth, Fremont, CA (US);
Anurag Garg, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 176 days.

(21) Appl. No.: 18/370,773

(22) Filed: Sep. 20, 2023

(51) Int. Cl.
| G11C 7/22 | (2006.01) |
| G11C 7/06 | (2006.01) |
| G11C 7/12 | (2006.01) |
| G11C 8/10 | (2006.01) |
| G11C 8/18 | (2006.01) |
| H03K 19/20 | (2006.01) |

(52) U.S. Cl.
CPC ............... G11C 7/222 (2013.01); G11C 7/06 (2013.01); G11C 7/12 (2013.01); G11C 8/10 (2013.01); G11C 8/18 (2013.01); H03K 19/20 (2013.01)

(58) Field of Classification Search
CPC ...................................................... G11C 7/222
See application file for complete search history.

(56) References Cited

U.S. PATENT DOCUMENTS

| 5,987,556 A * | 11/1999 | Nakagawa ............ | G06F 9/3879 |
| | | | 712/E9.067 |
| 7,818,526 B2 * | 10/2010 | Jang ....................... | G11C 29/02 |
| | | | 365/201 |

* cited by examiner

*Primary Examiner* — Hoai V Ho
(74) *Attorney, Agent, or Firm* — Haynes Beffel & Wolfeld LLP; Andrew L. Dunlap

(57) ABSTRACT

A method and system are provided for controlling clock operation in a memory that applies a test mode to test functionality of the memory which controls timing in a self-time loop using an external clock that on a rising edge triggers a main clock and on a falling edge provides a reset timer return path to reset the main clock signal. In the reset timer return path, a rising edge of the external clock triggers start of a self-time loop, and the rising edge of the external clock also controls the reset timer return path to block generation of a reference bit line (RBL) signal. In the reset timer return path, a falling edge of the external clock generates the RBL signal to provide an external clock return signal to enable an end of cycle for the self-time loop.

20 Claims, 4 Drawing Sheets

MEMORY WITH EXTERNAL CLOCK SYNCHRONIZED OPERATION

TECHNICAL FIELD

The present disclosure generally relates to a memory circuit. More particularly, the present disclosure relates to control of timing of the memory.

BACKGROUND

Internal clocks of a memory can be self-timed from the rising edge of a clock external to the memory. During memory testing (e.g., during a test or debug mode), the falling edge of the external clock can be used to measure the functionality of the memory circuit during critical timing operations. The memory test mode is entered to test functionality of the memory, including logic components as well as storage elements in the memory. Such memory test modes are used to debug features of the memory including features that have critical timing requirements. Such debug testing is used to evaluate both functionality as well as manufacturing yield during a test phase.

SUMMARY

Embodiments provide a method and system are provided for controlling clock operation in a memory that applies a test mode which controls timing. The method applies a test mode which controls timing using an external clock to test functionality of the memory. The method further provides a reset timer return path from the timer control circuit to the internal clock generation circuit to reset a main clock signal (MCLKB) activated in the internal clock generation circuit, the reset timer return path providing, during the test mode, a main clock return MCLKB_RET signal to the internal clock generation unit in dependence on the external clock, wherein a rising edge of the external clock triggers start of a self-time loop during which the main clock signal MCLKB is set and then reset. The rising edge of the external clock controls setting of the main clock signal MCLKB and enables the reset timer return path to block generation of a reference bit line (RBL) signal to prevent generation of the main clock return signal (MCLKB_RET) until the falling edge of the external clock. The falling edge of the external clock causes a generation of a reference bit line (RBL) signal, on the reset timer return path, to provide the main clock return MCLKB_RET signal to enable an end of cycle for the self-time loop.

Embodiments of the method further control timing launch of a memory circuit component using the falling edge of the external clock during testing. The reset launch accomplishes triggering a sense amplifier enable (SAE) circuit, shutting off the column line decode circuit, shutting off the wordline decode circuit, and triggering a bitline restore circuit. Shutting off of the column line decode circuit and shutting off of the wordline decode circuit is done before the beginning of a next clock cycle for the self-time loop.

The reset timer return path in embodiments in a test mode further uses the external clock to enable a reference bitline read cycle and a reference bitline write cycle in separate signal paths. In some embodiments, the reference bitline read cycle and a reference bitline write cycle are provided on the same signal path of the reset timer return path.

For embodiments described herein, the external clock reset timer return path of the self-time loop in the test mode enables clock timing in the test mode to match a functional mode clock timing.

Embodiments of a system described herein have a memory clock control circuit that include an internal clock generation circuit, and a timer control circuit. The internal clock generation circuit includes: a main clock latch having a first input receiving an external clock signal CLK and an output providing a main clock signal MCLKB; and a reset latch having a first input receiving the external clock signal CLK and a second input for receiving a main clock return MCLKB_RET signal, and providing an output that resets the main clock latch. The timer control circuit includes: a first NOR gate having a first input receiving the external clock signal CLK through a buffer as a test clock signal T1CLK, a second input receiving a test clock signal TEST_CLK and having an output; a second NOR gate having a first input receiving the output of the first NOR gate and a second input receiving the main clock signal MCLKB from the main clock latch and providing an output; a reference bit line (RBL) providing gate having (i) a power control input receiving the test clock signal T1CLK, (ii) an input coupled to the output of the second NOR gate and (iii) providing an output according to which the main clock return MCLKB_RET signal is provided to the second input of the reset latch of the internal clock generation circuit; and a bypass providing the test clock signal T1CLK from the first input of the first logic gate to the RBL providing gate, wherein the RBL providing gate is (i) disabled on a rising edge of the test clock signal T1CLK and (ii) enabled on a falling edge of the test clock signal T1CLK.

The memory clock control circuit in one embodiment provides control of the reference bitline read cycle and reference bitline write cycle on the same signal path, while in another embodiment separates control of the reference bitline read cycle and reference bitline write cycle onto separate signal paths. For the reference bitline read cycle and reference bitline write cycle provided together on the same signal path, the timer control circuit receives a reference bitline read cycle signal RBLRD and a reference bitline write cycle signal RBLWR. The read cycle signal RBLRD and the write cycle signal RBLWR are then provided together to the reference bitline (RBL) gate as controlled by the output of the second NOR gate. For embodiments where the reference bitline read cycle and reference bitline write cycle are provided on separate signal paths, two separate enable signals are provided including a read enable signal (RD) that enables the reference bitline read cycle signal RBLRD to be provided. The other enable signal is the inverse of the read data enable signal (RDB) which is used to enable the reference bitline write cycle signal RBLWR to be provided.

In further embodiments, the reference bit line RBL that is fed back as the MCLKB_RET signal to the reset latch is also provided through a buffer as a stop clock (STCLK) signal and its inverse showing the latch signal is off (LOFF) to control other circuitry within the memory. The circuitry receiving the STCLK signal includes a column decode signal generator having an input controlled by the stop clock STCLK signal and the main clock signal MCLKB, and a wordline decode signal generator having an input controlled by the stop clock STCLK signal and the main clock signal MCLKB. The circuitry receiving the LOFF signal further includes a sense amplifier timing generator circuit having an input controlled by the inverse of the stop clock signal LOFF and the main clock signal MCLKB, and a bitline restore timing signal generator circuit having an input controlled by the inverse of the stop clock signal LOFF and the main clock signal MCLKB.

In further embodiments, a non-transitory computer readable medium that stores a digital representation of a memory clock control circuit that includes an internal clock generation circuit, and a timer control circuit. The internal clock generation circuit includes: a main clock latch having a first input receiving an external clock signal CLK and an output providing a main clock signal MCLKB; and a reset latch having a first input receiving the external clock signal CLK and a second input for receiving a main clock return MCLKB_RET signal, and providing an output that resets the main clock latch. The timer control circuit includes: a first NOR gate having a first input receiving the external clock signal CLK through a buffer as a test clock signal T1CLK, a second input receiving a test clock signal TEST_CLK and having an output; a second NOR gate having a first input receiving the output of the first NOR gate and a second input receiving the main clock signal MCLKB from the main clock latch and providing an output; a reference bit line (RBL) providing gate having (i) a power control input receiving the test clock signal T1CLK, (ii) an input coupled to the output of the second NOR gate and (iii) providing an output according to which the main clock return MCLKB_RET signal is provided to the second input of the reset latch of the internal clock generation circuit; and a bypass providing the test clock signal T1CLK from the first input of the first logic gate to the RBL providing gate, wherein the RBL providing gate is (i) disabled on a rising edge of the test clock signal T1CLK and (ii) enabled on a falling edge of the test clock signal T1CLK.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of embodiments described herein provide a memory with external clock synchronized operation.

Memory internal clocks can be self-timed from the rising edge of the external clock. Memory internal test modes to test functionality of the memory use the falling edge of the external clock to internally time the memory critical timings to debug internal memory critical timings that impact functionality or yield. Techniques to properly manage internal clock timings can result in timing hazards that impact the functionality or yield of the memory operation during the debut mode that can render the debug feature inoperable.

Embodiments described herein provide a memory architecture whereby critical internal timings are controlled by the external clock duty cycle and cycle time. Internal control of memory timings is architected to preserve critical margins to internal timings using self-timed operation.

Technical advantages of the memory architecture described herein provide for control of the rising edge and falling edge of the internal clock during test or debug operations. For the method with a reset timer return path, a rising edge of the external clock triggers start of a self-time loop during which the main clock signal MCLKB is set in an internal clock generator circuit and the rising edge of the external clock also controls the reset timer return path in the test control circuit to block generation of a reference bit line (RBL) signal to prevent generation of a reset return signal until the falling edge of the external clock. In the reset timer return path the falling edge of the external clock then generates the RBL signal that is used to provide an external clock return signal to enable an end of cycle and end the current clock cycle for the self-time loop.

Figure 1:
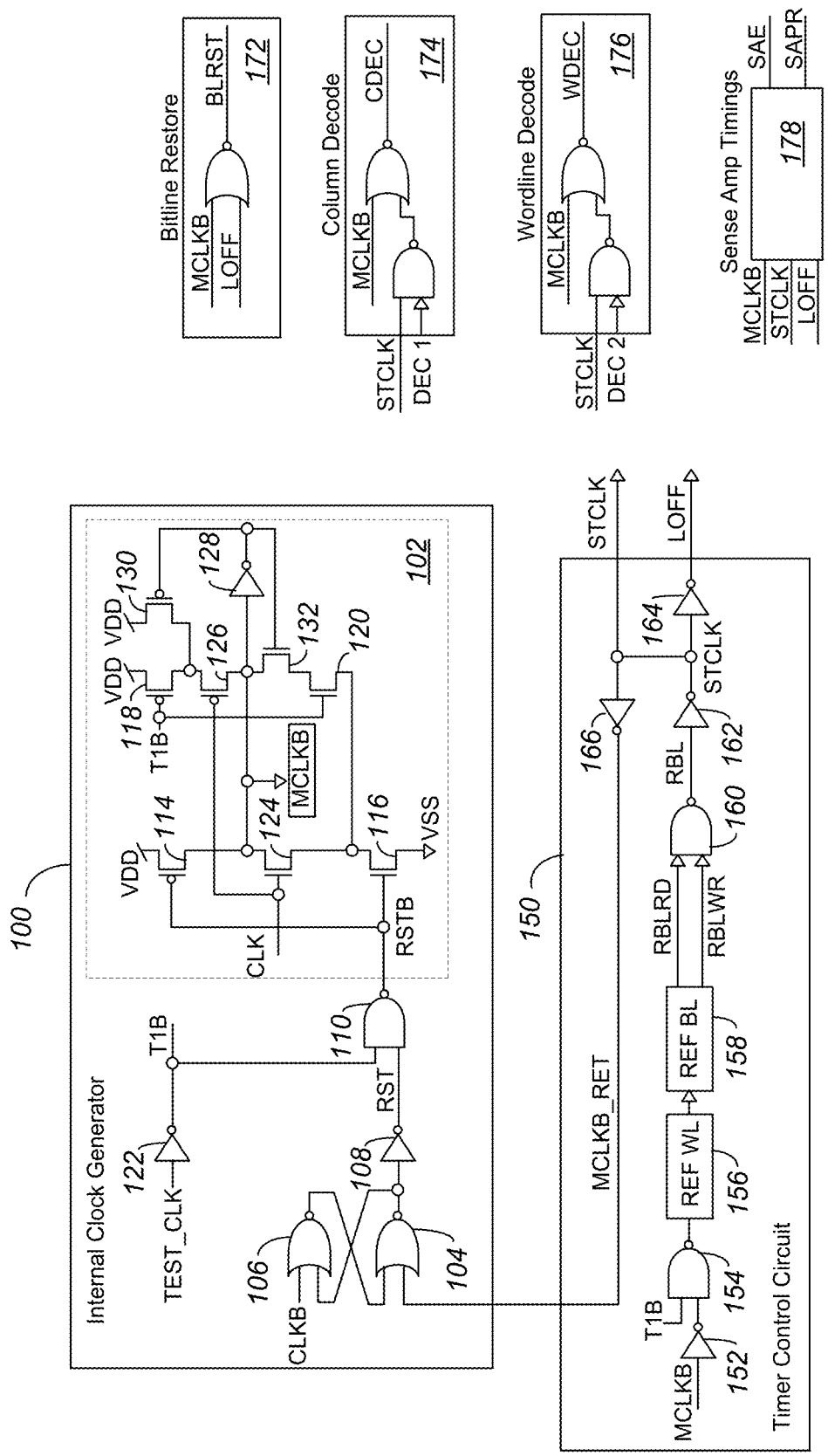
FIG. 1 is a circuit diagram of components of a memory used to provide a synchronized test mode timing system.

FIG. 1 is a circuit diagram of components of a memory used to provide a synchronized test mode timing system. The system of FIG. 1 includes an internal clock generator circuit 100 and a timer control circuit 150. The system shown in FIG. 1 for convenience also shows circuits components that are controlled by timing from the internal clock generator circuit 100 and timer control circuit 150 including: a bitline restore circuit 172; a column decode circuit 174; and a wordline decode circuit 176; and a sense amp timing circuit 178.

The internal clock generator circuit 100 receives an external clock signal (CLK) as well as a test clock signal TEST_CLK that identifies a test mode for the circuit. The external clock CLK and the test clock TEST_CLK are provided from one or more chips separate from the memory. The internal clock generator circuit 100 uses these inputs to generate a main clock (MCLKB) with "B" signifying an inverse of the main clock signal that is applied to begin the self-timing loop for the memory circuitry. The internal clock generator circuit 100 also receives a main clock return signal (MCLKB_RET) fed back from the internal circuitry to end the self-timed loop which will be described with respect to the timer control circuit 150.

In the internal clock generator circuit 100, the external clock (CLK) is provided to a first latch 102 that stores the state of the CLK signal to provide the main clock signal MCLKB. The first latch 102 is also referred herein as a main clock latch. A reset signal (RSTB) is provided to the first latch that is connected to power supply transistors to discharge the first latch and enable the clock CLK signal to reset the main clock MCLKB output of the first latch 102 to a high level.

The first latch 102 includes two transistors 124 and 126 with gates receiving the external clock CLK input. An inverter 128 has an input connected to the source of transistor 124 and a drain of transistor 126 and drives the gates of transistors 130 and 132 which provide power VDD to the first latch 102. The main clock signal MCLKB is also provided from the input of inverter 128. The reset signal RSTB is provided to transistors 114 and 116 which control power provided to the first latch 102 so that the first latch output main clock signal MCLKB is high when the reset signal RSTB is low and then follows the state of the external clock CLK when the reset signal RSTB is high. The test clock signal TEST_CLK is provided through an inverter 122 to provide a test clock low (T1B) signal. The first latch 102 includes transistors 118 and 120 that have gates connected to T1B so that the test clock controls the signal state of the first latch state during test mode.

The internal clock generator circuit 100 further includes a second latch formed by interconnected NOR gates 104 and 106. The second latch receives two inputs, the inverse of external clock CLKB and the main clock return signal MCLKB_RET. The output of the second latch is provided through inverter 108 to create the reset signal RST during functional operation. For convenience, the second latch is also referred to as a reset latch. With the second latch configuration shown, when the CLKB is high or logic 1, and MCLKB_RET is off or logic 0 then the second latch output at inverter 108 input will be logic 1 and RST will be high. With the CLKB going to logic 0 and MCLKB_RET still being 0, the second latch output at inverter 108 input remains at logic 1. The CLKB going to logic 1 will also trigger MCLK to transition to a logic 1. This in turn will cause reset RST to go to logic 0 to reset MCLKB back to a logic 1. MCLK_RET eventually goes back to a logic 0 after the timer control circuit delay, but the second latch retains the reset state of RSTB signal until CLKB returns to a logic 0 state.

The reset signal RST is provided to a NAND gate 110 along with the test signal T1B, and the output of the NAND gate 110 provides the reset low RSTB signal to the first latch 102. With the configuration, the output of the NAND gate 110 will be active so that RSTB follows the state of RST except when the TEST_CLK signal is high. The test mode, thus, effectively disables the reset signal RST through the NAND gate 110. The output RSTB of the NAND 110 will thus be high when the TEST_CLK is not asserted and the CLK signal is asserted as high so that RST goes to logic 1. The reset RSTB will be active or logic 1 from the time the CLK goes high until the MCLKB_RET transitions. The RSTB at logic 0 effectively connects power to the first latch 102 through transistor 114, while the RSTB at logic 1 will connect the first latch 102 to VSS through transistor 116 and reset the first latch 102 state to logic 0.

The timer control circuit 150 of FIG. 1 provides a reset timer control path that generates the main clock return signal MCLKB_RET for providing to reset the second latch made up of NOR gates 104 and 106 of the internal clock generator circuit 100. The timer control circuit 150 has two inputs, the main clock MCLKB signal and the test clock signal T1B, and produces three outputs including the main clock return signal MCLKB_RET, a stop clock signal STCLK and a latch off LOFF signal which is the inverse of the stop clock signal STCLK. The main clock input MCLKB is provided through an inverter 152 to the first input of a NAND gate 154 while the test signal T1B is provided to a second input of the NAND gate 154. As with the NAND gate 110, the T1B signal being active in a logic 0 state (TEST_CLK is active or logic 1) disables the output of NAND gate 154. When the T1B signal is inactive or a logic 1, the output of the NAND gate 154 will be active to pass the main clock signal MCLKB.

When the clock signal rising transition occurs with T1B signal active in the timer control circuit 150, the main clock MCLKB rising edge triggers a reference wordline signal in circuit 156 and a reference bitline signal in reference bitline 158.

The output of NAND gate 154 creates a reference bitline signal accessing the reference wordline 156 and reference bitline 158 to create a read RBLRD or a write RBLWR signal provided to the memory NAND gate 160 which will generate a reference bitline signal (RBL). The RBL signal is provided through inverter 162. The output of the inverter provides the stop clock signal STCLK. The output of inverter 162 is provided through inverter 164 which has an output providing the latch off (LOFF) signal which is the inverse of the STCLK signal. The output of inverter 162 is also provided through inverter 166 to provide the main clock reset signal MCLKB_RET.

In operation, the timer control circuit 150 provides the main clock return signal MCLKB_RET signal when the test clock T1B is inactive and the reference bitline read or write has taken place. In the internal clock generator circuit 100, the second latch formed by NOR gates 106 and 104 will provide the RST signal from the time the external clock CLK pulse is applied until the main clock return MCLKB_RET is received from the timer control circuit 150.

In the operation with the circuit of FIG. 1, the external clock CLK controls the timing for both the rising and falling edge of the main clock return signal MCLKB_RET in the self-time loop without the test clock signal T1B applied. The timer control circuit 150 and self-time loop are bypassed with the test clock signal (T1B) active and the test clock controls the first latch 102 normally controlled by self-time loop without the test clock signal (T1B) being applied.

With such operation in the system of FIG. 1, several problems are identified that can occur. First, addresses in the address latches opening (a new address) with respect to clock reset margins influenced by the test clock can be compromised requiring external addresses to be held after the clock falling edge of the external clock (CLK) signal that can be blocked by the test clock. Such addresses are accessed by the timer control circuit using the reference wordline circuit 156 or the reference bitline circuit 158 in the timer control circuit 150. Second, a bitline restore signal to memory sense amplifiers with the sense amplifier margins can result in early bitline pre-charge before sense amplifiers are enabled interrupting critical memory access timing when the test clock is applied. The sense amplifier timing circuitry 178 is shown in FIG. 1 as controlled by the Latch Off LOFF and Stop Clock STCLK signals as well as the main clock signal MCLKB, with all these signals being affected by the test clock signal T1B operation.

Figure 2:
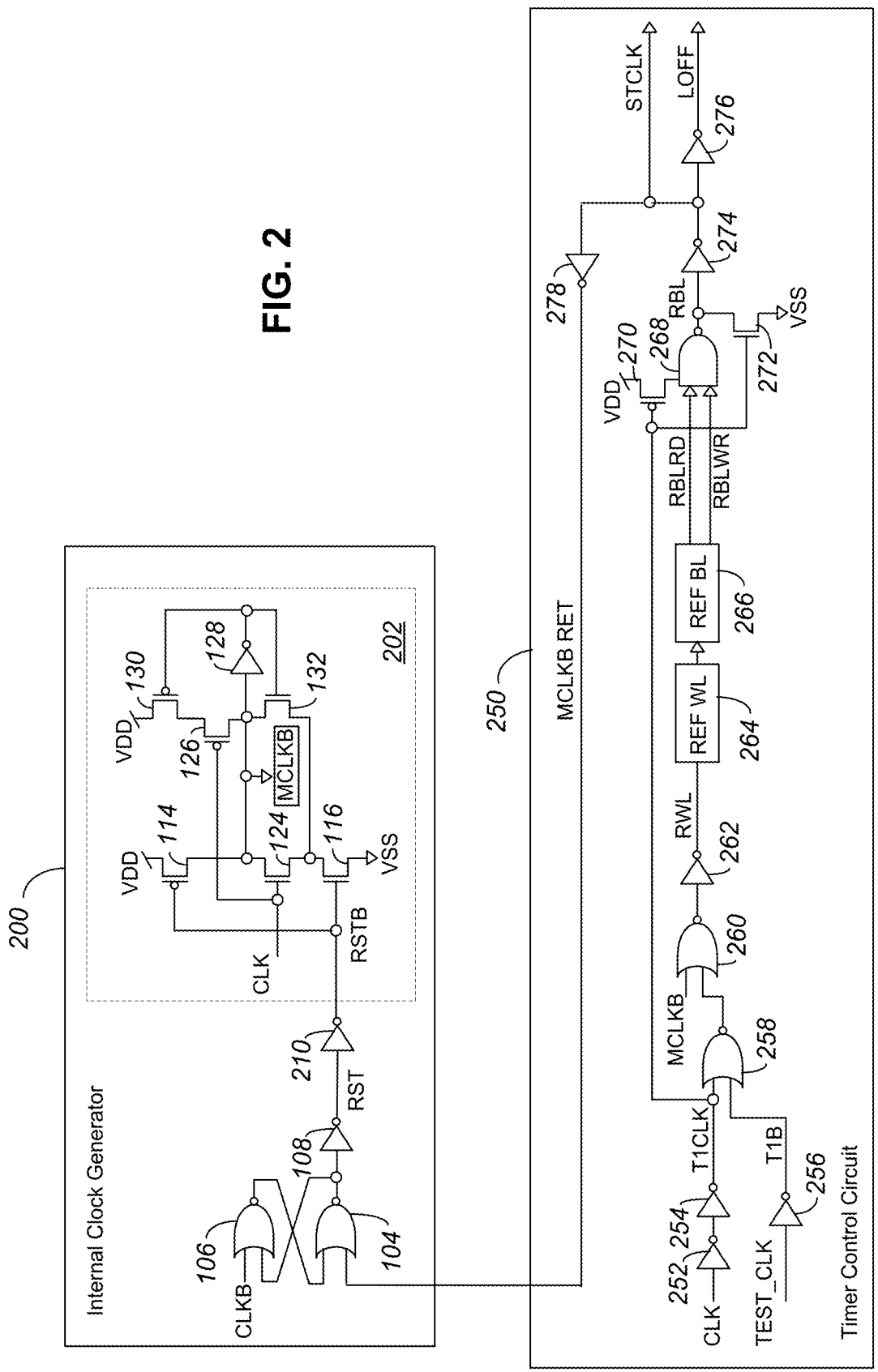
FIG. 2 is a circuit diagram of components of a memory with a synchronized test mode timing system according to an embodiment providing for a test mode signal to control reset timing using the falling edge of the external clock signal as controlled by the test mode signal.
Figure 3:
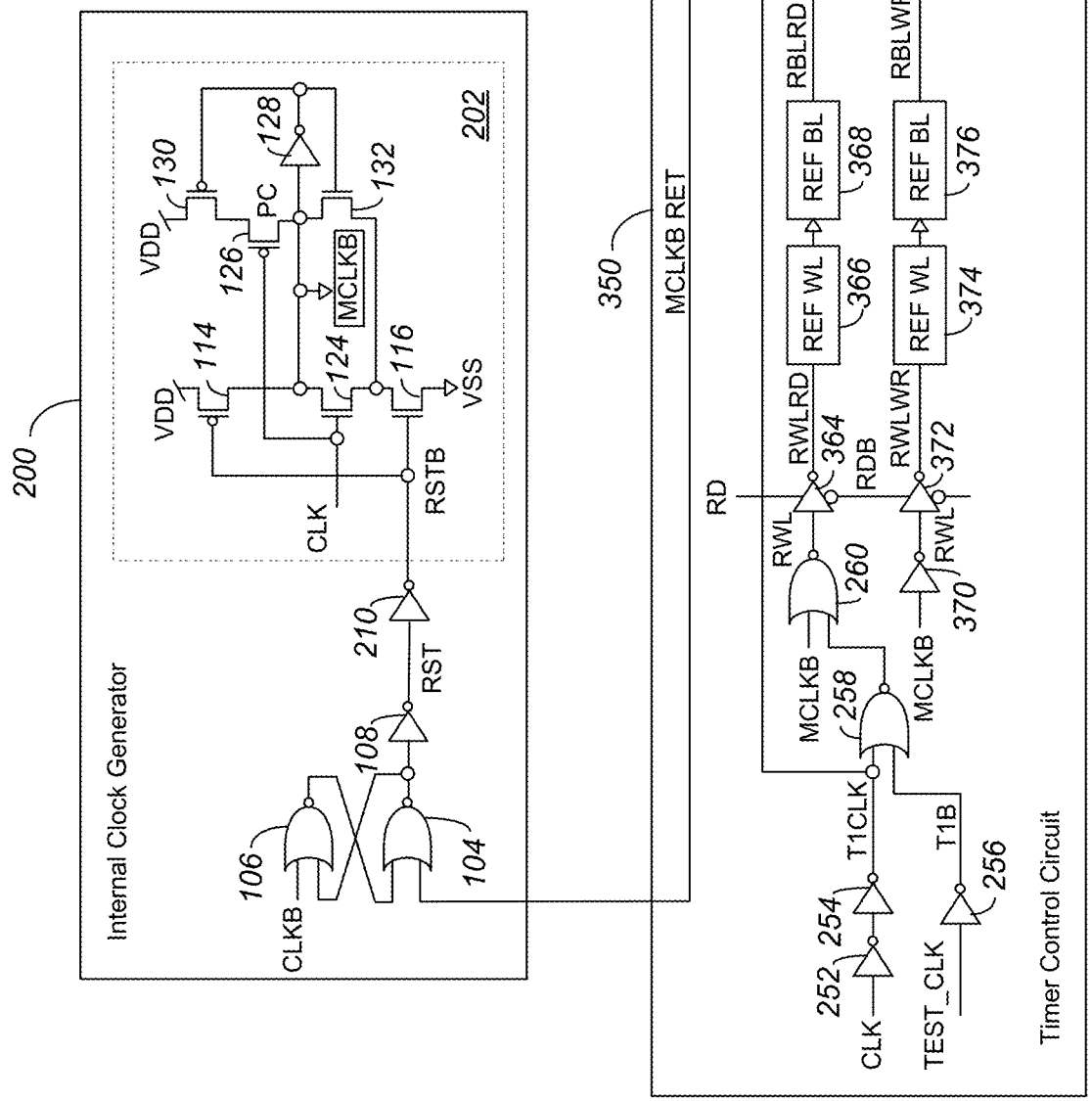
FIG. 3 is a circuit diagram of components of a memory with a synchronized test mode timing system according to an embodiment providing for a test mode signal with separate read and write signal control paths.

FIG. 1 shows internal circuitry components for bitline restore 172, column decode 174, wordline decode 176 and sense amplifier timings 178 that will be similarly reference in subsequent drawing FIGS. 2-3, although not shown in the subsequent figures. The sense amplifier timing block diagram 178 was referenced and described above. A further circuit, the bitline restore circuit 172 includes a NOR gate for receiving the main clock MCLKB and latch off signals LOFF and provides a signal for bitline restore BLRST as an output. The column decode circuit 174 receives as inputs the stop clock signal STCLK along with a column decode enable signal DEC 1 and the main clock MCLKB. In the column decode circuit 174, the stop clock STCLK and column decode enable signals are provided to a NAND gate, while the output of the NAND gate is provided along with the main clock MCLKB signal to a NOR gate that effectively makes the main clock signal MCLKB an enable signal. The output of the NOR gate provides the column decode signal CDEC. The wordline decode circuit 176 has components similar to the column decode circuit 174, except in the wordline decode it receives a wordline decode enable signal DEC 2 instead of the column decode signal DEC 1 of the column decode circuit 174. Further, the output of the wordline decode circuit from a NOR gate provides the wordline decode (WDEC) signal.

In the operation of the circuit of FIG. 1, the internal main clock MCLKB is self-timed using the timer control circuit 150 and internal clock generator circuit 100 with the self-time looping beginning at the rising edge of the external clock CLK. Memory test modes that use the falling edge of the external clock to internally time the memory critical timings debug internal memory critical timings during a test mode that impact functionality or yield. A problem exists in that this technique may not properly manage internal clock timings and can result in the creation of other timing hazards that impact the functionality or yield of the memory operation during the debug or test mode, rendering the debug feature inoperable.

FIG. 2 provides a circuit diagram of components of a memory with a synchronized test mode timing system according to an embodiment providing for a test mode signal to control reset timing using the falling edge of the external clock signal as controlled by the test mode signal. In FIG. 2, the internal clock generation circuit 200 is controlled by the rising edge of the external CLK and reset occurs in the reset timer control path from the timer control circuit 250 that enables the test or debug mode to control the falling edge operation so that it is provided in the same manner as in a functional mode.

FIG. 2, similar to FIG. 1, includes an internal clock generator circuit 200 and a timer control circuit 250. Changes made to the internal clock generator circuit in FIG. 2 include removal of the test clock signal circuitry receiving the test clock signal TEST_CLK and T1B signals in the internal clock generator circuit 200. The first latch 202 of the internal clock generator circuit 200, thus, has transistors 118 and 120 of FIG. 1 that control the first latch 112 of FIG. 1 using the T1B signal removed. Further, the NAND gate 110 receiving the T1B signal of FIG. 1 is replaced by an inverter 210 and the inverter 122 receiving the TEST_CLK signal are removed in FIG. 2. Components of the first latch 202 carried over from FIG. 1, otherwise are the same are labeled with the same reference numbers.

The test clock TEST_CLK controls timing of the main clock return MCLKB_RET signal in the timer control circuit 250 so that during test mode, the falling edge of the clock signal MCLKB matches operation as in a functional mode.

In the timer control circuit 250 of FIG. 2, the TEST_CLK signal is provided through inverter 256 to generate the T1B signal. Further, the external clock signal CLK is received through two inverters 252 and 254 to provide a timer clock signal T1CLK. The T1CLK and T1B signals are provided as inputs to a NOR gate 258 so that the output of NOR gate 258 will be logic 0 unless both the external clock CLK signal is 0 and the test clock TEST_CLK is at logic 1 (T1B is low 0). The output of the NOR gate 258 is provided to NOR gate 260. A second input to the NOR gate 260 is provided by the main clock MCLKB. As such, the output of NOR gate 260 will be active to pass the MCLKB signal when the test clock TEST_CLK is asserted as logic 1. The active TEST_CLK will effectively enable the output of NOR gate 260. The output of the NOR gate 260 is provided through an inverter 262 to provide the reference wordline (RWL) signal to address a read or write operation. Thus, when the TEST_CLK is 1 and the MCLKB signal is active in a low state 0, then the RWL signal will go high to 1 to access the reference wordline register 264 and reference bitline register 266 and subsequently create a reference bitline read RBLRD signal or a reference bitline write RBLWR signal for purposes of generation of the MCLKB_RET signal.

The T1CLK in the timer control circuit 250 is also provided in a bypass path to the gates of power supply transistors 270 and 272 that control the NAND gate 268 which provides the reference bit line RBL signal used to generate the main clock return signal MCLKB_RET. This T1CLK bypass has the effect of enabling the timer control circuit 250 to control the RBL signal directly at the falling edge of the T1CLK signal so that the gating transistor 270 will power the NAND gate 268. The rising edge of the T1CLK signal, however, will turn on transistor 272 to pull down the output of the NAND gate 268 to disable the RBL signal at the rising edge of T1CLK.

Following the output of NOR gate 260, the circuitry and function to reference a wordline and bitline are similar to that of FIG. 1. The output of NOR gate 260 is provided through an inverter 262 to create a reference wordline RWL signal accessing the reference wordline register 264 and reference bitline register 266 to read or write to a memory address and to cause generation of the read RBLRD or a write RBLWR signal when the read or write are complete. The RBLRD or RBLWR signal is then provided to the memory NAND gate 160 which will generate a reference bitline signal (RBL). The RBL signal is provided through inverter 274. The output of the inverter 274 provides the stop clock signal STCLK. The output of inverter 274 is provided through inverter 276 which has an output providing the latch off (LOFF) signal which is the inverse of the STCLK signal. The output of inverter 274 is also input to inverter 278 to provide the main clock reset signal MCLKB_RET.

In functional operation, the timer control circuit 250 provides the main clock return signal MCLKB_RET signal when the test clock T1B is active and the reference bitline read or write has taken place. Unlike with the timer control circuit 150 of FIG. 1, the rising edge of the T1CLK will pull down the RBL signal, while the T1CLK falling edge will trigger the RBL signal based on receipt of the RBLRD or RBLWR signal. In the internal clock generator circuit 200, the second latch formed by NOR gates 106 and 104 will provide the RST signal from the time the rising edge of the external clock CLK pulse is applied until the main clock return MCLKB_RET is received from the timer control circuit 250 after the falling edge of the T1CLK signal.

FIG. 3 is a circuit diagram of components of a memory with a synchronized test mode timing system according to an embodiment providing for a test mode signal with separate read and write signal control signal paths. FIG. 3 includes an internal clock generator circuit 200 and a timer control circuit 350. The internal clock generator circuit 200 includes the same components as in FIG. 2 which are similarly labeled. The timer control circuit 350 includes components modified from the timer control circuit 250 of FIG. 2 to separate the read and write signal control signal paths.

The timer control circuit 350, as with the timer control circuit 250 of FIG. 2, begins with inverter 256 receiving the test clock TEST_CLK signal and providing T1B as an output, as well as series inverters 252 and 254 receiving the external clock CLK signal to provide the T1CLK signal. For convenience, components carried over from the timer control circuit 250 of FIG. 2 to the timer control circuit 350 of FIG. 3 are similarly labeled. The T1CLK and T1B signals are provided as inputs to NOR gate 258. As such, the NOR gate output will be logic 0 unless the test clock TEST_CLK is 1 or active. The output of NOR gate 258 is provided to NOR gate 260. A second input to the NOR gate 260 is provided by the main clock MCLKB. As such, the output of NOR gate 260 will be active to pass the MCLKB signal unless the test clock TEST_CLK is asserted as logic 1. The active TEST_CLK will effectively disable the output of NOR gate 260. The output of NOR gate 260 will then provide a reference word line RWL signal to address a read or write operation.

The T1CLK in the timer control circuit 350 bypass path is slightly different in FIG. 3 because it is provided as a bypass path to one input of NOR gate 360, as opposed to power supply transistors 270 and 272 like in FIG. 2. The second input of the NOR gate 360 is provided from the reference bitline read signal (RBLRD). The output of the NOR gate 360 is provided as one of the inputs of NOR gate 380 which provides the reference bitline RBL signal. The T1CLK thus has the effect of disabling the RBL signal on the rising edge of the T1CLK when it transitions to logic 1 and enabling the RBL signal at the falling edge of T1CLK.

In the timer control circuit 350, the reference wordline read RWLRD path and reference wordline write RWLWR path are separated. For the reference wordline read RWLRD path, the output of NOR gate 360 is provided to address the reference read path and is provided as the reference wordline (RWL) signal through a tri-state buffer 364. The buffer 364 is activated by a read signal RD in the RWLRD path. When the RD signal is active, the reference wordline read signal RWLRD is passed to address the reference wordline as indicated in block 366 and address the reference bitline as indicated in block 368. The reference bitline read signal RBLRD when reading is complete is then provided to one input of the NOR gate 360 along with the T1CLK bypass signal. The output of NOR gate 360 is provided to one input of the NOR gate 380 so that the RBL signal is generated at the falling edge of the T1CLK signal and the RBLRD signal is active.

For the reference wordline write RWLRD signal path, a separate inverter 370 is provided rather than the output of NOR gate 360 to activate the path. The input to the inverter 370 is provided by the main clock signal MCLKB alone. The output of inverter 370 is provided as a separate reference wordline (RWL) signal through a tri-state buffer 372 in the separate write signal path. The buffer 372 is activated by an inverse of the read signal RDB to create the write signal enable. During a write operation, the RDB signal is active and the reference wordline write signal RWLWR is passed on the separate write signal path to control the reference wordline as indicated in block 374 and control the reference bitline as indicated in block 376. The reference bitline write signal RBLWR when writing is complete is then provided to an inverter 378 which passes the signal to a second input of NOR gate 380. The NOR gate 380 then provides the RBL signal, independent of the state of the T1CLK signal.

The RBL signal is input to inverters 276 and 278 in the timer control circuit 350 similar to the timer control circuit 250 of FIG. 2 to provide the main clock return signal MCLKB_RET as well as the latch off signal LOFF and the stop clock signal STCLK. Further operation from generation of the RBL signal in FIG. 3 is similar to that described with respect to FIG. 2.

The overall operation of the embodiments shown in FIGS. 2 and 3 provide several advantages. First, the internal clock generation circuit 200 is provided with timer control circuits 250 and 350 so it is controlled by the rising edge of the external clock CLK and reset occurs with the timer return path for MCLKB_RET in the same manner as in functional mode. Further, the external clock CLK generated T1CLK intercepts the timer delay in two places. A first intercept occurs before the generation of the Reference WL (RWL) read or write using MCLKB, preventing the RBLRD or RBLWR signals from triggering RBL before the T1CLK rising edge arrives. A second intercept occurs at the gate which generates the RBL signal, which is the NAND gate 268 of FIG. 2 or the NOR gate 380 of FIG. 3, where (i) the rising edge of T1CLK blocks generation of the RBL signal and timer control signals STCLK and LOFF and (ii) the falling edge of T1CLK triggers the generation of RBL and subsequently launches the MCLKB_RET as well as the STCLK and LOFF signals and triggering of the SAE clock.

Figure 4:
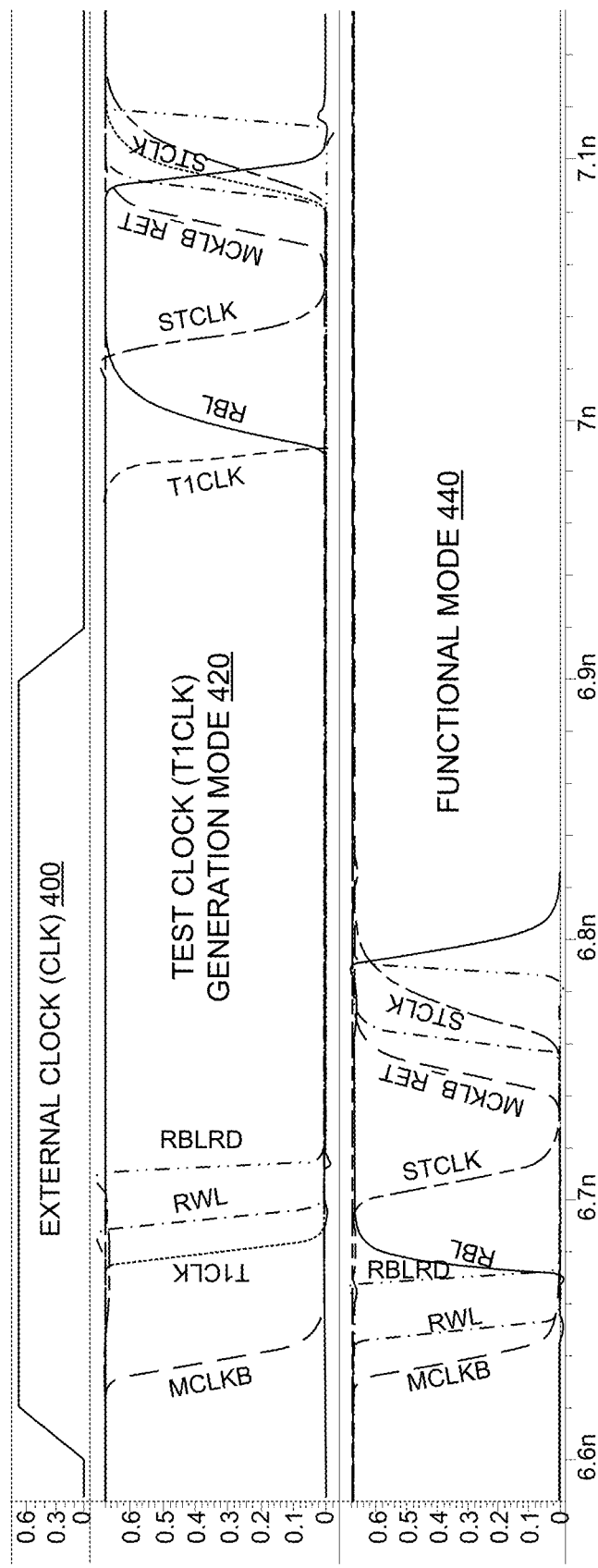
FIG. 4 shows signals provided from different points within the circuits or either FIG. 2 or FIG. 3.

FIG. 4 shows signals provided from different points within the circuits of either FIG. 2 or FIG. 3. The Y axis denotes the voltage measured at different points in the circuits of FIGS. 2 and 3 and the X axis denotes time in nanoseconds that the voltage is measured. The top signal is an exemplary external clock CLK signal labeled EXTERNAL CLK 400 which is used to reference two other groups of signals exemplary signals including those in a TEST CLOCK (T1CLK) generation mode 420 and those in a FUNCTIONAL MODE 440. FIG. 4 shows that in the TEST_CLK mode, RBL generation is blocked until after the T1CLK falling edge. Further in the TEST_CLK mode, the STCLK generation is triggered after the T1CLK falling edge. The MCLKB_RET signal is then generated after the falling STCLK signal.

FIG. 4 shows that the in the functional mode signals are all very similar to the test mode signals after the falling edge of T1CLK. In the functional mode, the MCLKB_RET is generated after the STCLK signal falls. The STCLK signal is triggered only after the RBLRD signal falling edge. The MCLKB reset then triggers the STCLK reset.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory clock control circuit comprising:
    an internal clock generation circuit comprising:
        a main clock latch having a first input receiving an external clock signal CLK and an output providing a main clock signal MCLKB; and
        a reset latch having a first input receiving the external clock signal CLK and a second input for receiving a main clock return MCLKB_RET signal, and providing an output that resets the main clock latch; and
    a timer control circuit comprising:
        a first logic gate having a first input receiving the external clock signal CLK through a buffer as a test clock signal T1CLK, a second input receiving a test clock signal TEST_CLK and having an output;
        a second logic gate having a first input receiving the output of the first logic gate and a second input receiving the main clock signal MCLKB from the main clock latch and providing an output;
        a reference bit line (RBL) providing gate having (i) a power control input receiving the test clock signal T1CLK, (ii) an input coupled to the output of the second logic gate and (iii) providing an output according to which the main clock return MCLKB_RET signal is provided to the second input of the reset latch of the internal clock generation circuit; and
        a bypass providing the test clock signal T1CLK from the first input of the first logic gate to the RBL providing gate, wherein the RBL providing gate is (i) disabled on a rising edge of the test clock signal T1CLK and (ii) enabled on a falling edge of the test clock signal T1CLK.

2. The memory clock control circuit of claim 1,
    wherein the timer control circuit receives a reference bitline read cycle signal RBLRD and a reference bitline write cycle signal RBLWR, and
    wherein the reference bitline read cycle signal RBLRD and the reference bitline write cycle signal RBLWR are provided together to the RBL providing gate as controlled by the output of the second logic gate.

3. The memory clock control circuit of claim 2,
    wherein the timer control circuit further includes a buffer having an input connected to the output of the RBL providing gate and having an output according to which the main clock return MCLKB_RET signal is provided to the second input of the reset latch,
    wherein the output of the buffer provides a stop clock STCLK signal, and
    wherein the memory clock control circuit further comprises:
        a column decode clock signal generator having an output controlled by the stop clock STCLK signal and the main clock signal MCLKB, and
        a wordline decode clock signal generator having an output controlled by the stop clock STCLK signal and the main clock signal MCLKB.

4. The memory clock control circuit of claim 3,
    wherein the output from the buffer is inverted to provide an inverse of the stop clock signal LOFF, and
    wherein the memory clock control circuit further comprises:
        a sense amplifier timing generator circuit having an output controlled by the inverse of the stop clock signal LOFF, the stop clock STCLK signal and the main clock signal MCLKB; and
        a bitline restore timing signal generator circuit having an output controlled by the inverse of the stop clock signal LOFF and the main clock signal MCLKB.

5. The memory clock control circuit of claim 1,
    wherein the timer control circuit receives a reference bitline read cycle signal RBLRD, which is provided to the RBL providing gate,
    wherein a read data enable (RD) signal is provided that enables the reference bitline read cycle signal RBLRD to be provided to the RBL providing gate,
    wherein the timer control circuit receives a reference bitline write cycle signal RBLWR that is driven by the main clock signal MCLKB,
    wherein an inverse of the RD signal (RDB) is provided that enables the reference bitline write cycle signal RBLWR to be provided,
    wherein the memory clock control circuit further comprises a second RBL providing gate having a first input receiving the output of the RBL providing gate, and a second input receiving the reference bitline write cycle signal RBLWR, and
    wherein an output the second RBL providing gate provides and RBL signal according to which the main clock return MCLKB_RET signal is generated.

6. The memory clock control circuit of claim 5,
    wherein the timer control circuit further includes a buffer having an input connected to the output of the second RBL providing gate and having an output providing the main clock return MCLKB_RET signal connected to the second input of the reset latch, wherein the input of the buffer provides a stop clock STCLK signal, and wherein the memory clock control circuit further comprises:
- a column decode clock signal generator having an output controlled by the stop clock STCLK signal and the main clock signal MCLKB, and
- a wordline decode clock signal generator having an output controlled by the stop clock STCLK signal and the main clock signal MCLKB.

7. The memory clock control circuit of claim 6,
wherein the input to the buffer is further buffered to provide an inverse of the stop clock signal LOFF, and
wherein the memory clock control circuit further comprises:
- a sense amplifier timing generator circuit having an output controlled by the inverse of the stop clock signal LOFF, the stop clock STCLK signal and the main clock signal MCLKB; and
- a bitline restore timing signal generator circuit having an output controlled by the inverse of the stop clock signal LOFF and the main clock signal MCLKB.

8. The memory clock control circuit of claim 1, wherein the first logic gate is a first NOR gate and the second logic gate is a second NOR gate.

9. A method for controlling clock operation in a memory, the method comprising:
applying a test mode which controls timing using an external clock to test functionality of the memory; and
providing a reset timer return path from the timer control circuit to the internal clock generation circuit to reset a main clock signal (MCLKB) stored in the internal clock generation circuit, the reset timer return path providing, during the test mode, a main clock return (MCLKB_RET) signal to the internal clock generation circuit in dependence on the external clock, wherein a rising edge of the external clock triggers start of a self-time loop during which the main clock signal MCLKB is set and then reset,
wherein the rising edge of the external clock controls setting of the main clock signal MCLKB and enables the reset timer return path to block generation of a reference bit line (RBL) signal to prevent generation of the main clock return signal MCLKB until the falling edge of the external clock, and
wherein a falling edge of the external clock causes a generation of a reference bit line (RBL) signal, on the reset timer return path, to provide the main clock return MCLKB_RET signal to enable an end of cycle for the self-time loop.

10. The method of claim 9, wherein the falling edge of the external clock controls a timing launch for memory circuit components comprising:
- triggering a sense amplifier enable (SAE);
- shutting off a column line decode;
- shutting off a wordline decode; and
- triggering a bitline restore.

11. The method of claim 10, wherein the triggering of the sense amplifier enable (SAE) clock in the test mode matches the triggering of the sense amplifier enable (SAE) clock in a functional mode.

12. The method of claim 9, wherein the falling edge of the external clock controls a timing launch of memory circuit components comprising:
- shutting off a column line decode; and
- shutting off a wordline decode, wherein the shutting off of the column line decode and the shutting off of the wordline decode is performed before the providing of the main clock return MCLKB_RET signal.

13. The method of claim 9, wherein, in the reset timer return path, the external clock is provided to enable separate reference wordline (RWL) signals to access a reference bitline read cycle and a reference bitline write cycle in the memory in separate signal paths.

14. The method of claim 13, wherein, in the reset timer return path, the reference bitline read cycle is controlled by the external clock and the reference bitline write cycle is self-timed.

15. The method of claim 9, wherein the reset timer return path provides a single reference wordline (RWL) signal to enable a reference bitline read cycle and a reference bitline write cycle together in the same signal path.

16. The method of claim 15, wherein when the test mode is applied, the timing of creation of the reference bit line RBL signal is created at the falling edge of the main clock MCLKB so that the test mode MCLKB timing matches MCLKB timing in a functional mode.

17. A non-transitory computer readable medium that stores a digital representation of a circuit comprising:
an internal clock generation circuit comprising:
- a main clock latch having a first input receiving an external clock signal CLK and an output providing a main clock signal MCLKB; and
- a reset latch having a first input receiving the external clock signal CLK and a second input for receiving a main clock return MCLKB_RET signal, and providing an output that resets the main clock latch; and a timer control circuit comprising:
- a first logic gate having a first input receiving the external clock signal CLK through a buffer as a test clock signal T1CLK, a second input receiving a test clock signal TEST_CLK and having an output;
- a second logic gate having a first input receiving the output of the first logic gate and a second input receiving the main clock signal MCLKB from the main clock latch and providing an output;
- a reference bit line (RBL) providing gate having (i) a power control input receiving the test clock signal T1CLK, (ii) an input coupled to the output of the second logic gate and (iii) providing an output according to which the main clock return MCLKB_RET signal is provided to the second input of the reset latch of the internal clock generation circuit; and
- a bypass providing the test clock signal T1CLK from the first input of the first logic gate to the RBL providing gate, wherein the RBL providing gate is (i) disabled on a rising edge of the test clock signal T1CLK and (ii) enabled on a falling edge of the test clock signal T1CLK.

18. The non-transitory computer readable medium of claim 17,
wherein the timer control circuit receives a reference bitline read cycle signal RBLRD and a reference bitline write cycle signal RBLWR, and
wherein the reference bitline read cycle signal RBLRD and the reference bitline write cycle signal RBLWR are provided together to the RBL providing gate as controlled by the output of the second logic gate.

19. The non-transitory computer readable medium of claim 17, wherein the timer control circuit receives a reference bitline read cycle signal RBLRD, which is provided to the RBL providing gate, wherein a read data enable (RD) signal is provided that enables the reference bitline read cycle signal RBLRD to be provided to the RBL providing gate, wherein the timer control circuit receives a reference bitline write cycle signal RBLWR that is driven by the main clock signal MCLKB, wherein an inverse of the RD signal (RDB) is provided that enables the reference bitline write cycle signal RBLWR to be provided, wherein the memory clock control circuit further comprises a second RBL providing gate having a first input receiving the output of the RBL providing gate, and a second input receiving the reference bitline write cycle signal RBLWR, and wherein an output the second RBL providing gate provides and RBL signal according to which the main clock return MCLKB_RET signal is generated.

20. The non-transitory computer readable medium of claim 17, wherein the output from the buffer is inverted to provide an inverse of the stop clock signal LOFF, and wherein the memory clock control circuit further comprises:

a sense amplifier timing generator circuit having an output controlled by the inverse of the stop clock signal LOFF, the stop clock STCLK signal and the main clock signal MCLKB; and a bitline restore timing signal generator circuit having an output controlled by the inverse of the stop clock signal LOFF and the main clock signal MCLKB.

* * * * *